June 24, 1969 J. L. BOYER 3,452,254

PRESSURE ASSEMBLED SEMICONDUCTOR DEVICE USING MASSIVE FLEXIBLY MOUNTED TERMINALS

Filed March 20, 1967

INVENTOR.
JOHN L. BOYER

BY
OSTROLENK, FABER, GERB & SOFFEN
ATTORNEYS

United States Patent Office 3,452,254

Patented June 24, 1969

3,452,254

PRESSURE ASSEMBLED SEMICONDUCTOR DEVICE USING MASSIVE FLEXIBLY MOUNTED TERMINALS

John L. Boyer, El Segundo, Calif., assignor to International Rectifier Corporation, El Segundo, Calif., a corporation of California Filed Mar. 20, 1967, Ser. No. 624,282
Int. Cl. H01l 5/00
U.S. Cl. 317—234 7 Claims

ABSTRACT OF THE DISCLOSURE

A semiconductor wafer has expansion plates on its opposite sides and is carried in a hermetically sealed subassembly consisting in part of two massive conductive bodies in pressure contact with the opposite expansion plates. Resilient headers or diaphragms are connected to peripherally central portions of the massive conductors and have outwardly extendng flanges which are joined by an insulating cylinder which completes the hermetic sealing enclosure for the semiconductor wafer. One of the flanges extends beyond the periphery of the insulation cylinder. The insulation cylinder contains a centrally located conductive disk having internally directed tongues and externally directed tongues where the internal tongue receives a gate lead from a semiconductor wafer forming a controlled rectifier, while the external tongue forms the external connection point for a gate connection.

This invention relates to a semiconductor subassembly suitable for compression bonded mounting, and more particularly relates to a compression bonded semiconductor subassembly in which a semiconductor device is contained within a hermetically sealed housing, formed of two massive conductive members on opposite surfaces of the wafer, which may be biased into high pressure engagement with the wafer by suitable mounting structures. The outer periphery of the massive conductors is connected to flexible headers joined by an external insulation cylinder which completes the hermetic enclosure for the wafer.

Semiconductor device subassemblies which are capable of being electrically connected to main housing devices through compressional forces, as contrasted to soldering, are well known. A typical structure of this patent type is shown in U.S. Patent 3,293,508, in the name of John L. Boyer, and assigned to the assignee of the present invention. It is common practice to carry the semiconductor wafer, which has expansion plates on its upper and lower surfaces, between two relatively thin sections of a flexible header or diaphragm. Thereafter, heavy conductive members are brought into engagement with the header portions adjacent the wafer surface in order to complete the electrical circuit to the wafer.

In accordance with the present invention, a novel subassembly is formed wherein the two massive conductors are connected directly in surface-to-surface engagement with the wafer expansion plates through pressure exerted by external clamping devices where these two massive elements form a portion of the hermetic sealing enclosure for the wafer. In order to flexibly support these two massive members, two headers or relatively thin diaphragms are connected to centrally located regions of the massive conductors and have extending circular flanges joined by an insulation cylinder. One of the massive conductors is formed with a depression or other suitable wafer locating means so that the wafer can be mechanically held in position on the massive conductor during assembly.

In order to provide increased flexibility for the headers, one of the headers has a flange extending appreciably beyond the periphery of the insulation cylinder and the insulation cylinder has a ring extending from one of its ends and outwardly to be joined to the large diameter header on a peripheral location which is beyond the outer periphery of the insulation ring. Thus, a relatively large area diaphragm is formed to provide improved flexibility for the assembly.

The massive conductive members are then formed to have flat and parallel end surfaces. The adjacent end surfaces which contact the wafer expansion plates have areas substantially equal to the areas of their respective expansion plates while their opposite end surfaces, which are adapted to be connected to clamping structures, are also provided with areas at least as large as the area of the wafer. Thus, the structure provides large contact areas both interiorly and externally of the device for improved operation and improved heat exchange qualities.

Accordingly, a primary object of this invention is to provide a novel compression bonded semiconductor device subassembly.

Yet another object of this invention is to provide a novel arrangement for compression bonded subassemblies which uses massive contact elements directly engaged with the semiconductor wafer expansion plates.

A further object of this invention is to provide a novel compact compression bonded subassembly for semiconductor wafers wherein at least one header has an enlarged diameter extending beyond the periphery of the insulation cylinder to impart increased flexibility to the header.

These and other objects of this invention will become apparent from the following description when taken in connection with the drawings, in which.

Figure 1:
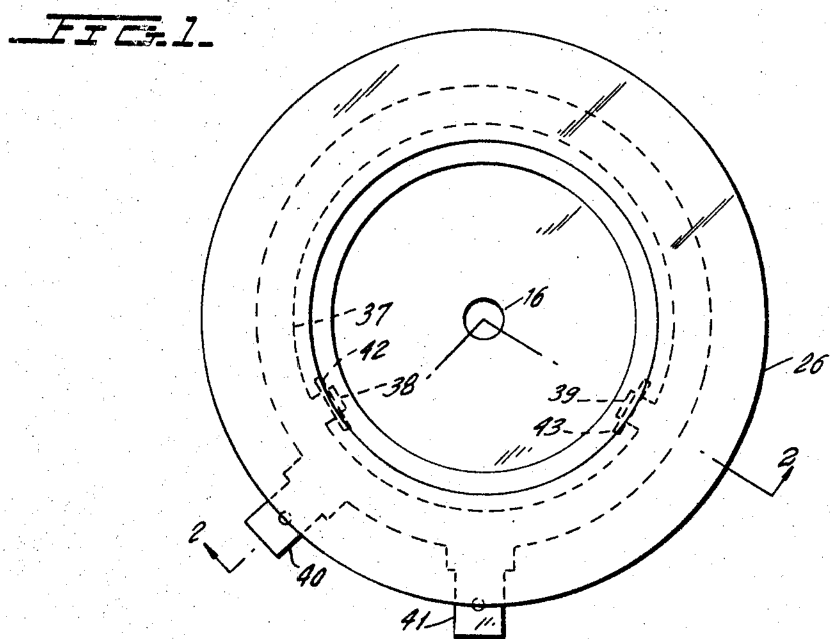
FIGURE 1 is a top view of the compression bonded subassembly of the invention.

Referring now to the figures, there is illustrated a typical wafer of semiconductor material 10 which is secured in the usual manner between expansion plates 11 and 12. The wafer 10 can, for example, be a wafer of silicon having junctions formed therein in any usual manner where, for example, the wafer can be formed as a controlled rectifier having an anode electrode connected to expansion plate 12 and a gate region connected to gate lead 13c. Expansion plates 11 and 12 are suitably soldered or otherwise connected to wafer 11 and may be composed of material having thermal expansion characteristics similar to that of the silicon. For example, expansion plates 11 and 12 may be of molybdenum or tungsten.

In accordance with the invention, a novel hermetically sealed pressure bonded structure is formed for the subassembly of wafer 10 and expansion plates 11 and 12, and is comprised of a lower massive electrode 13 and an upper massive electrode 14. Each of electrodes 13 and 14 have been termed massive in that they are at least 10 times the thickness of the subassembly of members 10, 11 and 12 and have diameters substantially equal to the diameter of the subassembly of members 10, 11 and 12. The electrodes 13 and 14 may be formed of copper or any other suitable conductive material and have flat parallel opposite end surfaces 13a and 13b and 14a and 14b, respectively. The end surfaces 13b and 14b are flat and parallel, and are adapted to receive some suitable clamping structure (not shown) which will supply the compressional forces for forcing surface 14a into high pressure engagement with expansion plate 12 and for forcing surface 13a into high pressure engagement with expansion plate 11.

Each of electrodes 13 and 14, which may be disk-shaped, are further provided with central openings 15 and 16, which may be used for purposes of alignment of the completed subassembly within the clamping structure.

The upper surface 13*a* of electrode 13 is formed of a depressed well having an outwardly extending peripheral wall 17. This depressed well structure has a diameter equal to or greater than the diameter of expansion plate 11 and a depth which is less than the thickness of expansion plate 11. Therefore, the well serves to physically receive the wafer subassembly and to prevent the wafer subassembly from inadvertent lateral movement without, however, permitting periphery 17 to extend up to the wafer 10 where inadvertent short-circuiting could occur across the wafer junctions should they extend to the wafer periphery.

In order to flexibly support electrodes 13 and 14, two headers 20 and 21 are provided which are relatively thin and are formed with corrugations as illustrated to improve their flexibility. The interior of header 20 is brazed to a centrally located peripheral portion of electrode 13 lying beneath flange 21*a* of header 13 while the interior of header 21 is brazed across the lateral portion of shoulder 22 in header 14. Note that the header 14 has a second tapered shoulder section 23 which accommodates the axial portion 24 of header 21 to aid in the flexibility of header member 21. Each of headers 20 and 21 then have outwardly extending flanges 25 and 26, respectively, which are ultimately secured to the insulation cylinder 27 which completes the hermetic enclosure for the wafer subassembly of members 10, 11 and 12.

More specifically, insulation cylinder 27 is provided with upper and lower metallizing surfaces 28 and 29 where metallizing surface 29 receives flange section 25 of header 20 while metallizing section 28 receives extending disk 29*a*. The disk 29*a* which extends beyond the outer periphery of insulation cylinder 27 is then secured to a circular welding rib 30 extending from flange section 26 of header 21 and which has a diameter larger than the exterior diameter of cylinder 27. Thus, the effective diameter of upper header 21 is the diameter of welding flange 30 so that an appreciable flexing action due to the large effective area of header 21, which is greater than the available area across insulation cylinder 27, is obtained.

Figure 3:
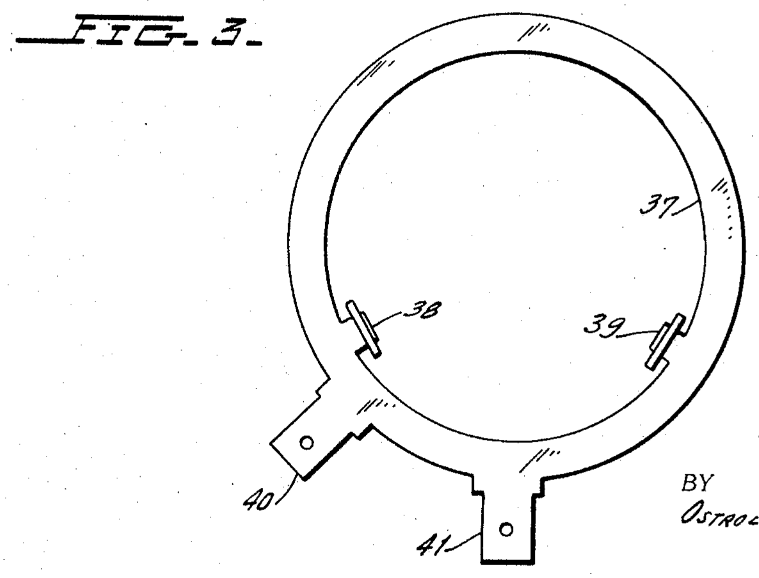
FIGURE 3 is a top view of the gate lead ring carried in the insulation cylinder of FIGURES 1 and 2.

In order to provide internal and external connection for gate lead 13*c*, the insulation cylinder 27 is made in an upper and lower half where the upper half is provided with end metallizing surface 35 while the upper portion of the lower half is provided with metallizing surface 36. These two metallizing surfaces then receive a conductive disk 37 between them which is shown in FIGURE 3.

Figure 2:
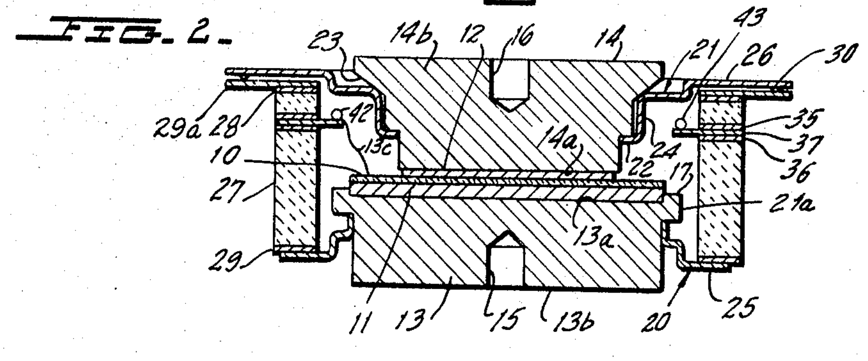
FIGURE 2 is a cross-sectional view of FIGURE 1 taken across the section lines 2—2 in FIGURE 1.

Disk 37, which may be a stamped member, is then provided with two internally extending tongue sections 38 and 39 and two externally directed tongue sections 40 and 41. The two internal sections then have short hollow tubes 42 and 43 brazed thereto which receive gate leads extending from wafer 10. Thus, FIGURE 2 illustrates gate lead 13*c* as connected to short cylinder 42. The external tongues 40 and 41 then serve as external terminals to which gate circuits may be connected. Note that during the assembly of the unit shown before electrode 14 and its header 21 are placed in position, gate lead 13*c* is inserted into tube 42, and the tube is crimped or soldered to the electrode 14. Header 21 is thereafter placed in position with a resistance weld being made between extending bead 30 of flange section 26 and the disk 29*a* which completes the manufacture of the subassembly. Note that if the wafer 10 were provided with two gate leads, the second gate lead would have been connected to the short cylinder 43.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A housing for a pressure connected semiconductor device, said pressure connected semiconductor device comprising a thin flat wafer of semiconductor material and thin flat first and second expansion plates having thermal characteristics similar to the thermal characteristics of said semiconductor material permanently connected to the respective opposite surfaces of said wafer; said housing comprising first and second massive electrodes when compared to the size of said wafer and expansion plates, an insulation cylinder, and first and second thin flexible headers; said first and second electrodes having flat, parallel end surfaces having an area at least substantially equal to the area of the outwardly facing surfaces of said first and second expansion plates; said first and second electrodes having a thickness of about at least 10 times the thickness of said wafer and first and second expansion plates; said first and second electrodes, said wafer and said first and second expansion plates stacked atop one another with the inner end surfaces of said first and second electrodes in substantially full area contact with the said outwardly facing surfaces of said first and second expansion plates, respectively; said first and second headers having centrally located openings therein; the interior of said centrally located openings connected to axially central peripheral portions of said first and second electrodes, respectively; said insulation cylinder concentrically surrounding said stacked first and second electrodes, said first and second expansion plates, and said wafer; said first and second headers having outwardly extending flange portions connected respectively to the upper and lower end of said insulation cylinder; the outer flat end surfaces of said first and second electrodes extending in respective parallel planes which are located externally of the planes respectively containing said upper end and said lower end of said insulation cylinder; and a thin disk having a central opening therein; the interior surface of said thin disk connected to said upper end of said insulation cylinder; said thin disk having an outwardly extending region extending beyond the outer periphery of said insulation cylinder; said outwardly extending flange of said first header lying atop said thin disk and axially spaced from said thin disk; said outwardly extending flange of said first header connected to said thin disk around a periphery having a diameter greater than the outer diameter of said insulation cylinder.

2. The housing as set forth in claim 1 wherein said inner end surface of said second electrode has an upwardly extending outer peripheral portion having a height less than the thickness of said second expansion plate and a diameter at least equal to the diameter of said second expansion plate, thereby to receive said second expansion plate and to prevent substantial lateral movement of said second expansion plate.

3. The housing as set forth in claim 1 wherein said second electrode has an upper flange adjacent the top surface thereof extending laterally therefrom and extending axially downwardly for only a portion of the thickness of said second electrode to define a shoulder in the exterior of said second electrode; said second header interior diameter connected to said outer periphery of said second electrode beneath said shoulder.

4. The housing as set forth in claim 3 wherein said inner diameter of said second header has an upwardly bent section extending coaxially with said second electrode; the interior surface of said upwardly bent section secured to the outer periphery of said second header beneath said shoulder.

5. The housing as set forth in claim 1 wherein said first electrode has a shoulder in the outer periphery thereof; said central opening in said first header connected around said shoulder.

6. The housing as set forth in claim 5 wherein said first header has a short radially extending section leading outwardly from its said central opening having a length greater than the depth of said shoulder, and an upwardly bent, axial section concentric with a portion of the central periphery of said first electrode; said outwardly extending flange section of said first header extending outwardly from the top of said axial section.

7. The housing as set forth in claim 1 wherein said insulation cylinder has an upper and lower section; a conductive disk interposed between said upper and lower sections; said conductive disk having a radial thickness equal to the radial thickness of said insulation cylinder; said conductive disk having internally and externally extending tongue sections.

References Cited

UNITED STATES PATENTS

| | | | |
|---|---|---|---|
| 2,861,226 | 11/1958 | Lootens | 317—234 |
| 3,225,416 | 12/1965 | Diebold | 29—25.3 |
| 3,238,425 | 3/1966 | Geyer | 317—234 |
| 3,280,388 | 10/1966 | Kadelburg | 317—234 |
| 3,292,056 | 12/1966 | Emeis et al. | 317—234 |
| 3,293,508 | 12/1966 | Boyer | 317—234 |
| 3,310,716 | 3/1967 | Emeis | 317—234 |

JOHN W. HUCKERT, *Primary Examiner.*

R. F. POLISSACK, *Assistant Examiner.*

U.S. Cl. X.R.

174—50, 50.54, 50.55, 52.5, 53; 317—235